United States Patent [19]
Materna

[11] Patent Number: 4,499,443
[45] Date of Patent: Feb. 12, 1985

[54] HIGH-FIELD DOUBLE-PANCAKE SUPERCONDUCTING COILS AND A METHOD OF WINDING

[75] Inventor: Peter A. Materna, Lawrenceville, N.J.

[73] Assignee: The United States of America as represented by the United States Department of Energy, Washington, D.C.

[21] Appl. No.: 575,598

[22] Filed: Jan. 31, 1984

[51] Int. Cl.[3] ........................ H01F 7/22; H01L 39/24
[52] U.S. Cl. .................................... 335/216; 335/300; 29/599
[58] Field of Search ........................ 335/216, 299, 300; 174/126 S, 128 S; 336/232, DIG. 1

[56] References Cited

U.S. PATENT DOCUMENTS

| | | | |
|---|---|---|---|
| 3,129,359 | 4/1964 | Kunzler | 335/216 X |
| 3,205,461 | 9/1965 | Anderson | 335/216 X |
| 3,333,331 | 8/1967 | Swartz | 335/216 X |
| 4,277,768 | 7/1981 | Burgeson et al. | 335/216 |
| 4,437,080 | 3/1984 | Ekin et al. | 335/216 |

OTHER PUBLICATIONS

"Westinghouse Design of a Forced Flow $Nb_3Sn$ Test Coil for the Large Coil Program", Proceedings of the 8th Symposium on Engineering Problems of Fusion Research, vol. III, p. 1148, IEEE 1979.

"Design Considerations for Forced-Flow Super-Conductors in Tokamak Toroidal-field Coils", P. Matern, pp. 1-6, 10th Symposium on Fusion Engineering, Philadelphia, PA, Dec. 5-7, 1983.

"Experiment of 10-T, 60-CM-Bore $Nb_3Sn$ Test Module Coil (TMC-1) for the Cluster Test Program", T. Ando et al., Japan Atomic Energy Research Institute, Dec. 1982.

Annual Report, Massachusetts Institute of Technology, Jul. 1981-Jun. 1982, pp. 84-85.

Intor Report, International Atomic Energy Agency, Vienna, 1982, pp. 233-252.

*Primary Examiner*—George Harris
*Attorney, Agent, or Firm*—Jeannette M. Walder; Paul A. Gottlieg

[57] ABSTRACT

A double-pancake coil having first and second pancakes may comprise a plurality of conductor means, each conductor means having a different grade and having one or more conductors, wherein each pancake of said double-pancake coil is comprised of inner and outer turns; wherein said inner turns are comprised of at least one of said conductor means wound about an axis and nested within one another; wherein said outer turns are comprised of said inner conductor means and at least one other conductor means co-wound about said inner turns and nested within one another; wherein each of said conductor means is wound along said axis from said first pancake to said second pancake at a different turn.

18 Claims, 5 Drawing Figures

HIGH-FIELD DOUBLE-PANCAKE SUPERCONDUCTING COILS AND A METHOD OF WINDING

CONTRACTUAL ORIGIN OF THE INVENTION

The U.S. Government has rights in this invention pursuant to Contract No. DE-AC02-76CH03073 between the U.S. Department of Energy and Princeton University.

BACKGROUND OF THE INVENTION

This invention relates to high-field double-pancake coils and a method of winding, and particularly to superconducting magnet coils with graded conductor.

There are only two basic methods of winding: layer winding and pancake winding. The most common example of layer winding can be seen on an ordinary spool of thread: thread (or conductor) is wound about a cylindrical core by placing one turn next to another, proceeding down the core surface until a layer is formed covering the core. The second layer is wound on top of the first layer and proceeds up the core surface until a second layer is formed, and so on. In pancake winding, conductor is wound about a cylindrical core placing one turn on top of each preceding turn to form a plane of turns perpendicular to the axis of the cylindrical core. In double-pancake winding, two pancakes are formed. After completion of the first pancake, the conductor is wound along the axis at the outermost turn to start the second pancake next to the first. For the second pancake, the conductor spirals inward to the core, one turn nested within another. It can readily be seen that the double-pancake can also be wound starting from the outermost turn of the first pancake first spiralling inward, winding along the axis at the innermost turn to start the second pancake, then spiralling outward. Depending on the allowability of joints, it may be convenient to wind individual double pancakes or even pancakes separately (by spiralling inward or by spiralling outward or one of each), and then connect them with electrical joints. This method can be repeated any number of times to form a coil having a series of pancakes. The double-pancake method is particularly useful for winding superconducting magnets, because conductor joints can be easily formed on the outside of the coil and because the magnet can be manufactured in modular fashion with several double pancakes being wound at the same time and then brought together at final assembly.

The design of superconducting magnets offers new problems to overcome. Superconductors which are used in magnets encounter a natural limitation: the higher the local magnetic field to which the superconductor is exposed, the lower the current density allowed in the superconductor. A current density which is above the critical current density causes the superconductor to quench or become normal. Since the innermost turn of any magnet is exposed to the highest magnetic field and the outermost turn is exposed to a smaller field, the critical current density in the innermost (high-field) turns is typically 2 to 5 times less than the critical current density in the outermost (low-field) turns. If a magnet is wound of a single size and material conductor, then the current density in the magnet is limited to the current density in the high-field turns, wasting valuable conductor in the lower field regions. This is a severe penalty in large magnets in terms of cost, material, and space occupied by the windings.

Consequently, many designs of high-field superconducting magnets use more than one grade of superconductor (the grade of a superconductor is the amount of high-field it can withstand before going normal). For example, the coil winding may be divided into three regions: high, medium, and low fields. Since the maximum field for each region is different and since grading is commonly achieve by varying the current density through the conductor, different conductors having different current densities are used in each region: high current density conductor in the low field region, medium current density conductor in the medium field region, and low current density conductor in the high field region. Since all of the turns are connected electrically in series, they all carry the same current. For these turns grading may be achieved by varying the crossn-sectional area of the conductor (current density grading). Grading is also achieved by changing the conductor material (conductor material grading). Graded superconductor is particularly convenient for layer wound magnets. It is also possible to grade the conductor in a double-pancake winding if several sizes of conductor are available and if electrical joints between the different grades of conductor are allowed within the winding. However, grading is not particularly convenient for certain pancake wound magnets.

One promising superconductor for nuclear fusion applications (e.g. toroidal field coils) is a superconducting material such as $Nb_3Sn$ enclosed in a conduit through which a cryogenic coolant such as supercritical helium can flow. This is referred to generally as "forced flow conductor". One way of winding such a conductor in double-pancake form uses large plates with shelves provided to support the conductor. Presently, forced flow conductor double-pancake windings are not graded because of the extreme difficulty in providing electrical joints within the winding.

An important design criteria for toroidal field coils such as are used on a tokamak machine is the space in the center of the machine. All the torodial field coils on a tokamak machine meet in the center of the machine where space is a premium. Reducing the size of the toroidal field coils could save millions of dollars in the cost of a fusion reactor. It has been estimated that for a typical $1 billion superconducting tokamak, for every centimeter by which the radial thickness of the inner leg of the toroidal field coils is reduced (which reduces the major radius of the plasma by that amount), the overall machine cost is reduced by $3.5 million.

Therefore, it is an object of the present invention to provide a double-pancake coil using graded conductor with electrical joints outside the winding.

It is another object of the present invention to provide a coil which minimizes the space required for the inner legs of a toroidal field coil.

It is yet another object of the present invention to provide a method of winding a double-pancake coil which reduces the size of the coil.

It is still another object of the present invention to provide a method of winding coils which improves reliability due to the absence of electrical joints within the windings.

It is also an object of the present invention to provide an improved superconducting double-pancake coil using graded conductor with no internal electrical joints.

It is another object of the present invention to provide a double-pancake coil using graded forced flow conductor without internal electrical joints.

Additional objects, advantages, and novel features of the invention will be set forth in part in the description which follows, and in part will become apparent to those skilled in the art upon examination of the following or may be learned by practice of the invention.

SUMMARY OF THE INVENTION

To achieve the foregoing and other objects and in accordance with the purposes of the present invention, a double-pancake coil having first and second pancakes may comprise a plurality of conductor means, each conductor means having a different grade and each conductor means having one or more conductors; wherein each pancake of th double-pancake coil is comprised of inner and outer turns; wherein said inner turns are comprised of at least one of said conductor means wound about an axis and nested within one another; wherein said outer turns are comprised of said inner conductor means and at least one other conductor means co-wound about said inner turns and nested within one another; wherein each of said conductor means is wound along said axis from said first pancake to said second pancake at a different turn.

A method of winding a double-pancake coil comprising a plurality of conductor means, each conductor means having a different grade and each conductor means having one or more conductors, may comprise the steps of: (a) winding at least one of said conductor means about an axis to form the inner turns of the first pancake of said double-pancake coil, said first inner turns nesting within one another; (b) co-winding said inner conductor means and at least one other conductor means about said inner turns to form the outer turns of the first pancake, said first outer turns nesting within one another; (c) winding each of said conductor means along said axis from the first pancake to the start of the second pancake of said double-pancake coil at a different turn; (d) winding said inner conductor means about said axis to form the inner turns of the second pancake, said second inner turns nesting within one another; and (e) co-winding said inner conductor means and said other conductor means about said second inner turns to form the outer turns of the second pancake, said second outer turns nesting within one another. It should be noted that the method can also be accomplished by winding the outer turns of the first pancake before the inner turns, with each turn nesting within each preceding turn (performing step b before step a), then continuing with steps c through e as above.

BRIEF DESCRIPTION OF THE DRAWINGS

The present invention is illustrated in the accompanying drawings wherein.

DETAILED DESCRIPTION OF THE INVENTION

Figure 1:
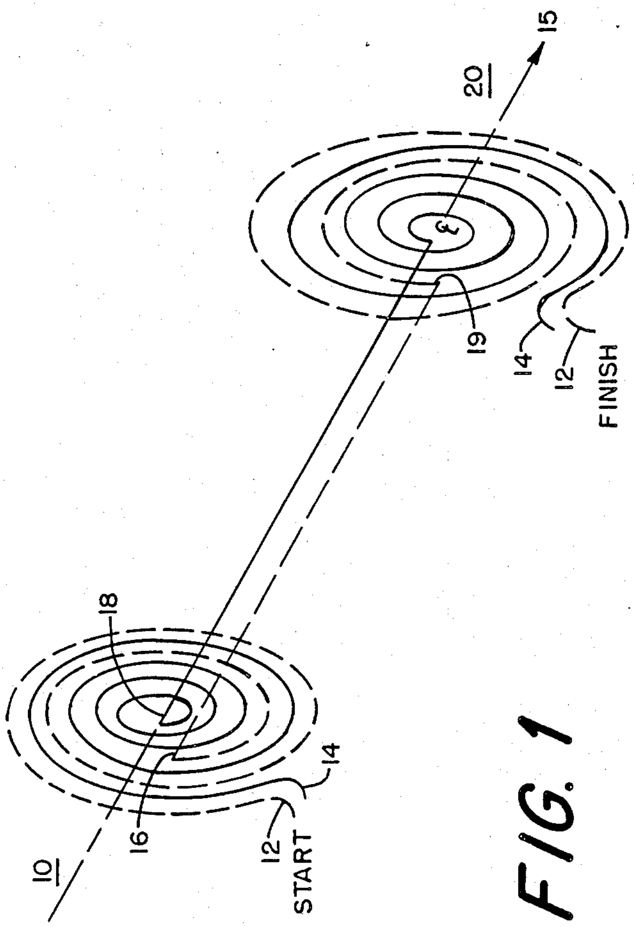
FIG. 1 is a schematic of a double pancake wound coil having two grades of conductors.

In FIG. 1, a double-pancake coil using two grades of conductor is shown in schematic form. Starting from the outside of first pancake 10, low field grade conductor means 12 and high field grade conductor means 14 enter the outside of the pancake and spiral inward together about axis 15. When the dividing point 16 between the grades is reached, conductor means 12 is wound along axis 15 (crosses over) to second pancake 20. Conductor means 14 continues to spiral inward to the inner bore 18, where conductor means 14 is then wound along axis 15 (crosses over) to pancake 20, where it begins to spiral outward. When conductor means 14 reaches point 19 it joins conductor means 12 and both conductor means are co-wound spiralling outward to finish pancake 20.

In FIG. 1 the two pancakes have been separated for clarity and because of this the crossovers (or transfers) between pancakes are shown using right angles. In an actual magnet the pancakes would almost touch and the crossovers would be made with angles much more gradual than shown.

The transfer (or crossover) location from one pancake to the next should be chosen so that the margin to critical current for the high-field grade conductor at the inner bore is approximately the same as the margin to critical current for the low-field grade conductor at the transfer location.

In the double-pancake coil, the inner turns (the highest field turns) are all high-field grade conductor. The outer turns are a mixture of low-field grade and high-field grade conductors. This can also be thought of as an inner magnet of high-field grade turns inside an outer magnet of low-field grade turns in which the leads from the inner magnet are brought out in a helical path in the same plane as the rest of the magnet by being co-wound with the low-field grade turns.

Conductor means 12 or 14 may be a single conductor or a group of identical conductors wound in hand. The important criteria is that the grade of the conductor be different in the two conductor means. Clearly, it can be seen that the winding technique can be extended to form coils having three or more grades, each conductor means having a different transfer or crossover point between pancakes.

In FIG. 1 conductor means 12 crosses over at the innermost outer turn and conductor means 14 crosses over at the innermost turn. For a coil having three grades of conductor (first, second, and third conductor means), the inner turns are comprised of the first conductor means, the outer turns are comprised of the first, second, and third conductor means, the first conductor means crosses over at the innermost turn, the second conductor means crosses over at the innermost turn of the outer turns, and the third conductor means crosses over at another of the outer turns.

Grading may be achieved by different schemes. Grading can be achieved by changing the superconductor material. Since $Nb_3Sn$ is a better superconductor for high magnetic fields than NbTi ($Nb_3Sn$ has a larger value of upper critical field), $Nb_3Sn$ can be used for the high field grade conductor and NbTi for the low field grade conductor. This could be done using either the same or different cross-sectional areas for the two grades.

In situations where it is desirable to use only a single superconductor material, current density is the principal variable available to differentiate the high field grade and the low-field grade. The high field grade must have a lower current density than the low field grade. If the different conductors are connected in series, they all carry the same current. Grading can then be achieved by changing the cross-sectional area for the two grades of conductors. Consequently, the high current density conductor will have a smaller cross-sectional area than the low current density conductor.

The new coil configuration permits the use of a third grading scheme. The new configuration achieves grading in a double-pancake coil having only a single type of conductor and is especially applicable to the forced flow conductor. If the cross-sectional area of the conductors are the same, current density grading is achieved by applying different currents to the two "grades" of conductor. This is readily accomplished because the different conductors are wound "in hand" and may be connected electrically in parallel at the external joint connections.

If, for example, the current in the low current conductor (14) is half the current in the high current conductor (12), this can be accomplished by splitting one high current path into two low current paths at the external joints. However, since all connections are external to the windings, it is possible to run the two "grades" at any relative currents if separate power supplies are used.

Figure 2:
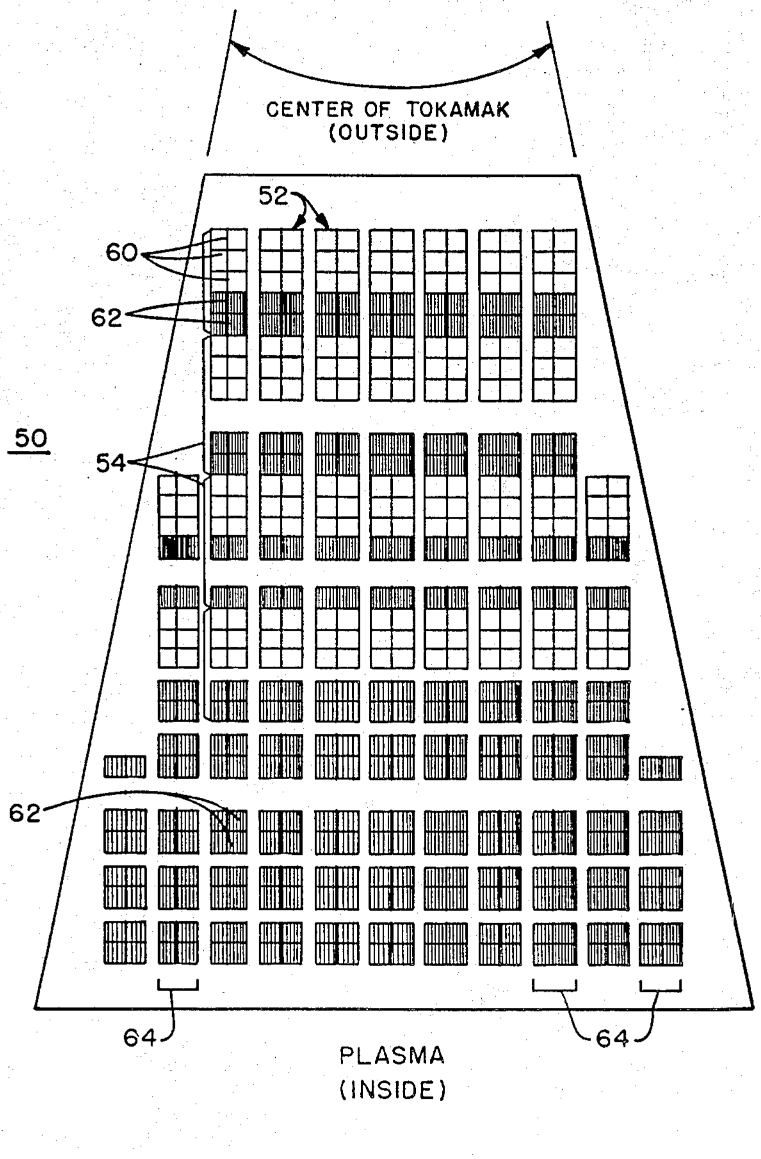
FIG. 2 is a cross-section of a wedge-shaped nose section of a toroidal field coil in which the full-size pancakes have 28 turns from inside to outside.

In FIG. 2 of wedge-shaped nose section 50 of a toroidal field coil, such as would be used on a tokamak machine, full-size pancakes 52 (of double pancakes 64) have 28 turns from inside (the region nearest the plasma) to outside (the region nearest the center of the tokamak). In this winding pattern, five conductors (54) are wound in hand starting at the outside of the winding. Three of these are low field grade (high current) conductors 60 and two are high field grade (low current) conductors 62. In the inner part of the winding only the two high-field grade (low-current) conductors are used. This particular coil design has a total of 492 turns; for each full size pancake 52 five conductors (54) were wound in hand four times and two conductors 62 were wound in hand an additional four times.

It should be noted that FIG. 2 shows only the cross-section of the inner leg of the toroidal field coil. The outer leg is the mirror image of the nose section: the high field grade (low current) conductor is still nearest the plasma, but the low field grade (high current) conductor is on the outside of the machine, farthest from the center of the tokamak. FIG. 2 shows the nose (inner leg) of the toroidal field coil, the leg nearest the center of the tokamak, which is where space is at a premium and is where space is saved using this winding method.

The benefits obtained using the new coil configuration of the present invention are demonstrated in the following Example.

EXAMPLE

Consider the design of superconducting toroidal field coils for a tokamak machine such as the proposed Tokamak Fusion Core Experiment (TFCX). There would be 16 coils spaced about the machine, each coil having the highest field turn (the turn closest to the bore of the coil or plasma) at approximately 1.875 m from the centerline of the tokamak.

Consider a traditionally wound ungraded double-pancake coil having the same dimensions as the coil in FIG. 2 and same number of turns: 492. Then the maximum field at the turn closest to the bore of the coil (this is the largest field seen by any turn) is obtained by applying Ampere's Law to the currents in the inner leg of all the toroidal field coils:

$$B = \frac{.2I\,(492\text{ turns})(16\text{ coils})10^{-6}}{1.875\text{ m}}$$

For the following currents, the following fields are obtained:

| I | B |
|---|---|
| 8 kA | 6.72 T |
| 10 kA | 8.40 T |
| 12 kA | 10.08 T |
| 15 kA | 12.60 T |

Figure 3A:
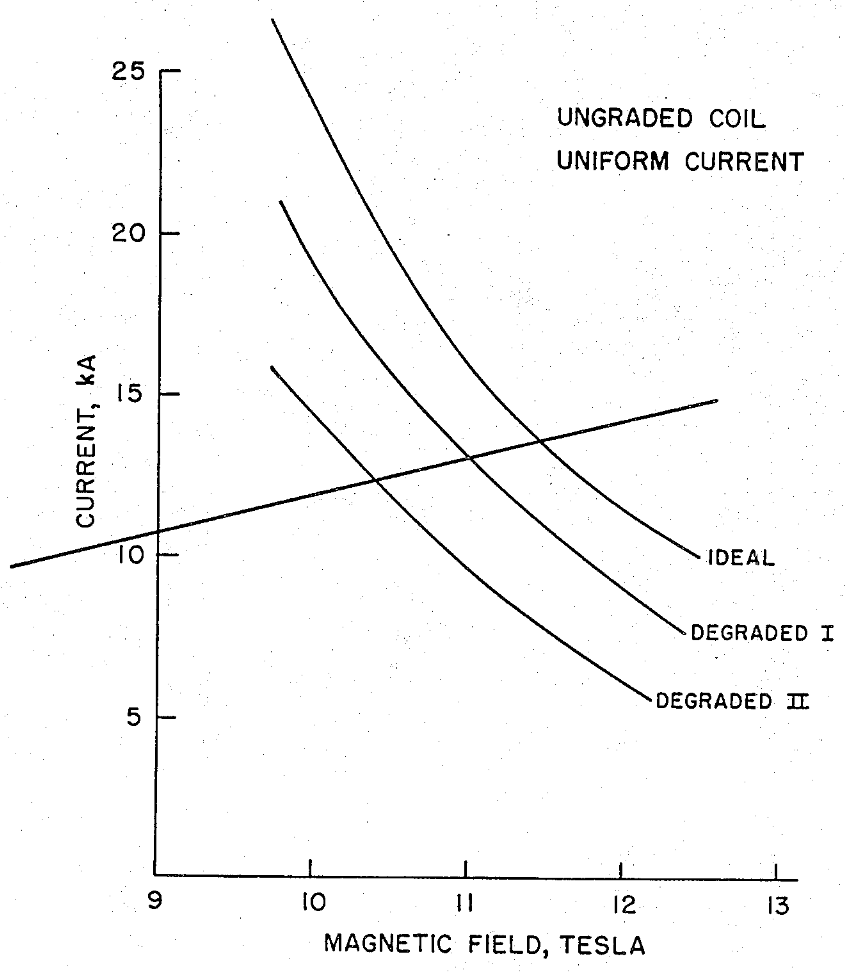
FIG. 3(A–C) are graphs showing various load lines intersecting critical current vs. magnetic field characteristics for (A) uniform winding, (B) highest field low-current turn, (C) highest field high-current turn.

This establishes the load line for the traditionally wound coil having 492 turns as shown in FIG. 3A.

At this point it is necessary to compare the load line to the critical current vs magnetic field characteristics of the conductor. In FIG. 3A, the load line is plotted against three characteristic curves for a typical design of an $Nb_3Sn$ forced flow conductor. The ideal curve is an ultimate performance curve for an unstrained $Nb_3Sn$ forced flow conductor. Since a actual conductor is strained (bent) when wound, the characteristics of the conductor become degraded. Hence, two curves denoted Degraded I and Degraded II are also shown. Degraded I reflects degradation factors of 78%. Degraded II represents the strain degradation data from FIG. 28 of Larbalestier, IEEE, Transactions on Magnetics, Vol. MAG-17, No. 5, September, 1981. The operating point for this coil is the intersection of the load line and the chosen characteristic curve. For uniform winding, the load line intersects the ideal curve at 11.45 T, Degraded I at 11.0 T and Degraded II at 10.4 T.

To establish a similar calculation for the graded coil two calculations are needed. First, the maximum field at the turn closest to the coil bore is found using the currents in all the turns. Since there are 300 low current turns and 192 high current turns, at the bore, $$B = \frac{.2\,[I_{low}(300) + I_{high}(192)](16\text{ coils})10^{-6}}{1.875\text{ m}}$$

| $I_{low}$ | $I_{high}$ | B |
|---|---|---|
| 8 kA | 16 kA | 9.34 T |
| 10 kA | 20 kA | 11.67 T |
| 12 kA | 24 kA | 14.01 T |

Figure 3C:
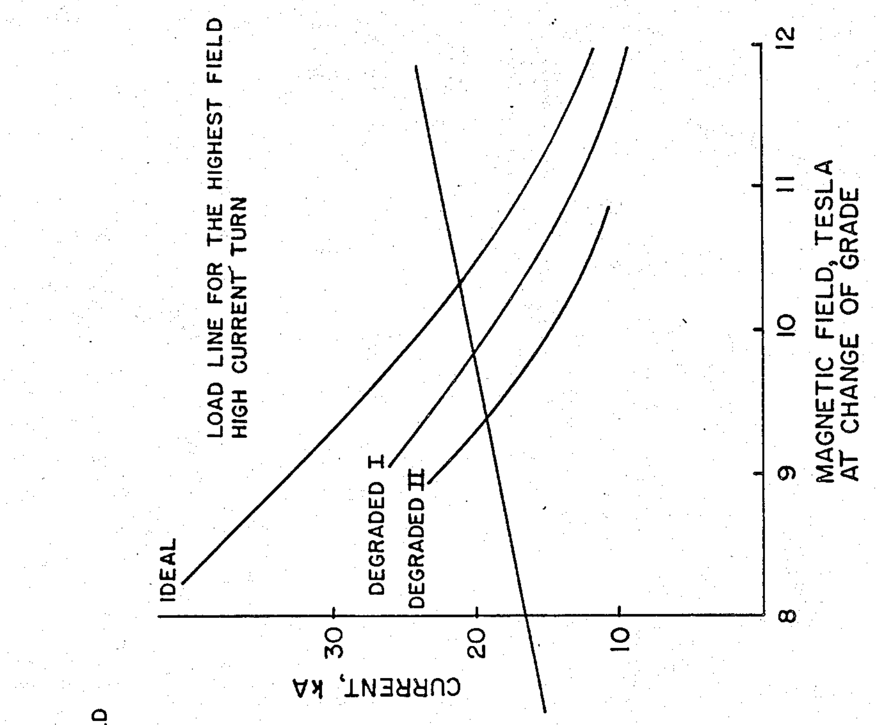
Figure 3B:
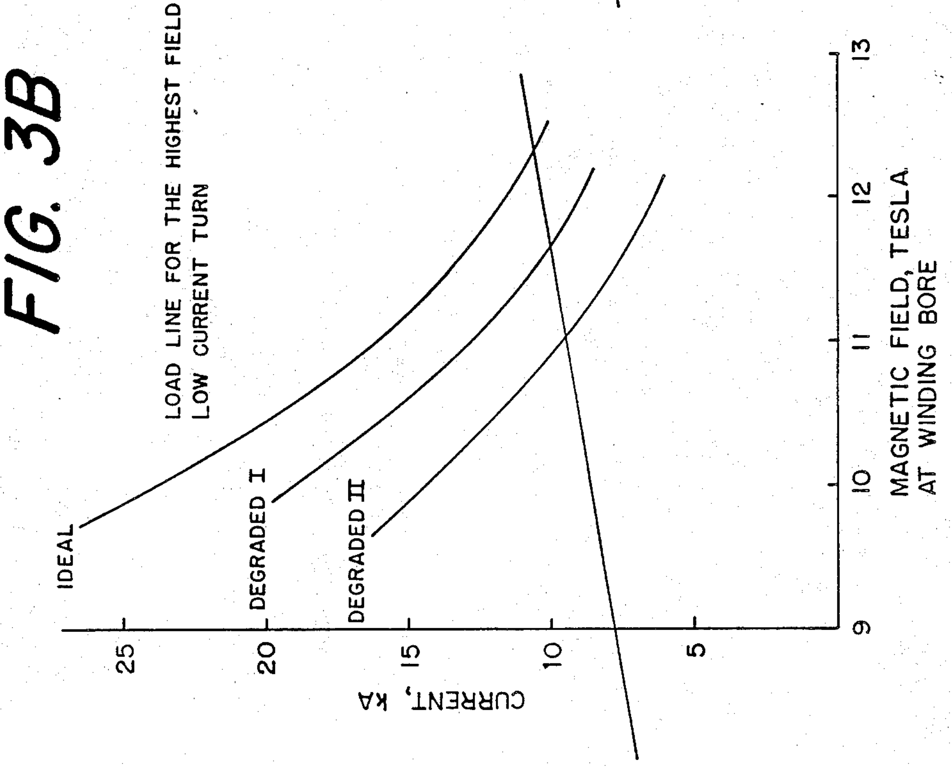

This establishes the load line for the innermost part of the winding which is served only by low current conductor as shown in FIG. 3B.

Second, the maximum field at the innermost high current turn is the sum of the fields for those high and low current turns closer to the machine center than the change of grade point, which is 1.55 m from the machine center. This includes 192 high current turns and 92 low current turns.

$$B = \frac{.2[I_{high}(192) + I_{low}(92)]16\ (\text{coils})10^{-6}}{1.55\ \text{m}}$$

| $I_{low}$ | $I_{high}$ | B |
|---|---|---|
| 8 kA | 16 kA | 7.86 T |
| 10 kA | 20 kA | 9.83 T |
| 12 kA | 24 kA | 11.79 T |

This establishes the load line for the highest field high current conductor as shown in FIG. 3C.

In this case it is assumed that the current from a high current turn will be split equally between two low-current turns in parallel. (Note: since the high current is exactly double the low current, this simplifies external bus connections—only one set is needed.) Thus the two load lines in FIG. 3B and FIG. 3C are plotted with a change of scale reflecting a factor of 2 for the current. Thus a single horizontal line intersecting both curves shows the operating condition. Whichever type of winding intersects the chosen characteristic curve at a lower current line, is the one which sets the performance limit of the coil. If the location for the change of grade is optimum, the two load lines will intersect the characteristic curves at approximately the same current line, i.e. the operating condition.

Referring to FIGS. 3B and 3C, using the ideal characteristic curves, the load line in FIG. 3B intersects the ideal curve at 10.5 kA giving a magnetic field at the bore of 12.3 T. The load line in FIG. 3C intersects the ideal curve at 21 kA (twice the low current). Thus each grade of conductor is on the verge of going normal at the operating point, which shows that the change of grade location was indeed optimum.

Comparing load line curves and the intersection points with the "ideal" characteristic curves, for the graded coil, the maximum magnetic field at the bore is 12.3 T, which compares to 11.45 T from the traditionally wound coil. Thus the benefit from using the new graded coil is 0.85 T, or in the range of a 7% increase in the maximum magnetic field. However, if this same increase had to be produced using a traditionally wound ungraded coil, it would be necessary to use 686 turns. This is obtained by observing that the load line for an ungraded coil intersects the "ideal" characteristic curve at 12.3 T only if the number 492 is replaced by 686 in the first equation at the beginning of this example. Since the cross-sectional area of a coil is directly related to the number of turns, the graded coil represents a 28% reduction in cross-sectional area and a substantial savings for $Nb_3Sn$.

Another comparison illustrating the advantage is to start with the traditionally-wound 492 turn coil whose load line intersects the "ideal" characteristic curve at (13.6 kA, 11.45 T), and hold the number of turns fixed. Suppose it is desired to obtain the same 11.45 T by replacing the ungraded winding with a graded winding of the same number of turns. Then, the operating current for the innermost turn is 9.8 kA, which is 28% less than the 13.6 kA previously. For the higher-current, low-field grade turns, the operating current is 19.6 kA which is 27% less than the critical current at that location from the "ideal" characteristic curve. (The change-of-grade location is close to optimum because these two percentages are so close to being equal.) The 27% represents the improvement obtained by grading.

In the example here, the "ideal" characteristic curve is used. The same principles of calculation would apply if one of the degraded curves were used. (Use of the "ideal" curve does not imply a complete lack of engineering margin because other margin is available from improvements in manufacturing methods.) At a later stage in design, this analysis could be refined to account for the fact that the conductor temperature at the locations of least margin would not be exactly 4.2° K., and might also be different for the two different grades of conductor. However, in some cases the difference in temperatures can be small, which would make the refinements minor, and in any event the foregoing example is the necessary first step illustrating the usefulness of the winding scheme.

While only certain embodiments of the invention have been shown, it is understood that the invention is capable of many modifications and may be used for any magnet, solenoid, etc.

The embodiments of this invention in which an exclusive property or privilege is claimed are defined as follows:

1. A double-pancake coil having first and second pancakes comprising a plurality of conductor means, each conductor means having a different grade, and each conductor means having one or more conductors;
   wherein each pancake of said double-pancake coil comprises inner and outer turns;
   wherein said inner turns comprise at least one of said conductor means wound about an axis and nested within one another;
   wherein said outer turns comprise said inner conductor means and at least one other conductor means co-wound about said inner turns and nested within one another; and
   wherein each of said conductor means is wound along said axis from said first pancake to said second pancake at a different turn.

2. The coil of claim 1 comprising first conductor means having one or more first conductors and second conductor means having one or more second conductors, said second conductor means being wound to form said inner turns, and said first and second conductor means being wound to form said outer turns, said second conductor means being wound along said axis at the innermost turn, and said first conductor means being wound along said axis at the innermost turn of said outer turns.

3. The coil of claim 2 wherein said first and second conductors comprise the same superconducting material having the same cross-sectional area and further comprising means for generating first and second currents therethrough.

4. The coil of claim 3 wherein said first current through each of said first conductors is twice said second current through each of said second conductors.

5. The coil of claim 4 wherein said first conductor means comprise three first conductors and said second conductor means comprise two second conductors.

6. The coil of claim 2 wherein said first and second conductors are forced flow conductors comprising a superconducting material enclosed in a cryogenic coolant filled conduit.

7. The coil of claim 2 wherein said first and second conductors comprise the same superconducting material, said first conductor having a different cross-sectional area than said second conductor, and further comprising means for applying the same current to each of said conductors.

8. The coil of claim 2 wherein said first conductor comprises a first superconducting material and said second conductor comprises a second superconducting material different from said first superconducting material.

9. The coil of claim 8 wherein said first superconducting material is NbTi and said second superconducting material is $Nb_3Sn$.

10. The coil of claim 1 comprising first, second, and third conductor means;

wherein said inner turns comprise said first conductor means;

wherein said outer turns comprise said first, second, and third conductor means;

said first conductor means being wound along said axis at the innermost turn of said inner turns, said second conductor means being wound along said axis at the innermost turn of said outer turns, and said third conductor means being wound along said axis at another turn of said outer turns.

11. A method of winding a double-pancake coil comprising a plurality of conductor means, each conductor means having a different grade and each conductor means having one or more conductors comprising the steps of:

(a) winding at least one of said conductor means about an axis to form the inner turns of the first pancake of said double-pancake coil, said first inner turns nesting within one another;

(b) co-winding said inner conductor means and at least one other conductor means about said inner turns to form the outer turns of said first pancake, said first outer turns nesting within one another;

(c) winding each of said conductor means along said axis from said first pancake to the start of the second pancake of said double-pancake coil at a different turn;

(d) winding said inner conductor means about said axis to form the inner turns of said second pancake, said second inner turns nesting within one another; and (e) co-winding said inner conductor means and said other conductor means about said second inner turns to form the outer turns of said second pancake, said second outer turns nesting within one another.

12. The method of claim 11 wherein the outer turns of the first pancake are wound before the inner turns of the first pancake.

13. The method of claim 11 comprising first conductor means having one or more first conductors and second conductor means having one or more second conductors, said second conductor means being wound to form said inner turns and said first and second conductor means being wound to form said outer turns.

14. The method of claim 13 wherein said first conductor means comprise three first conductors and said second conductor means comprise two second conductors.

15. The method of claim 13 wherein said first and second conductors comprise a superconducting material, said first conductor having a different cross-sectional area than said second conductor.

16. The method of claim 13 wherein said first conductor comprises a first superconducting material and said second conductor comprises a second superconducting material.

17. The method of claim 16 wherein said first superconducting material is NbTi and said second superconducting material is $Nb_3Sn$.

18. The method of claim 13 wherein said first and second conductors are forced flow conductors comprising a superconducting material enclosed in a cryogenic coolant filled conduit.

* * * * *